United States Patent [19]

Holderegger

[11] Patent Number: 5,347,925
[45] Date of Patent: Sep. 20, 1994

[54] SOLDER OR CONDUCTIVE PASTE PRINTING STENCIL HOLDER

[75] Inventor: Jürg Holderegger, Dätwil/Adlikon, Switzerland

[73] Assignee: PRSS - Maschinen AG, Winterthur, Switzerland

[21] Appl. No.: 910,016

[22] PCT Filed: Nov. 1, 1991

[86] PCT No.: PCT/CH91/00224
   § 371 Date: Jul. 9, 1992
   § 102(e) Date: Jul. 9, 1992

[87] PCT Pub. No.: WO92/08616
   PCT Pub. Date: May 29, 1992

[30] Foreign Application Priority Data

Nov. 19, 1990 [CH] Switzerland ............ 03664/90-6
Dec. 31, 1990 [DE] Fed. Rep. of Germany ... 9017591[U]

[51] Int. Cl.⁵ .................................... B05C 17/00
[52] U.S. Cl. ................. 101/127; 101/127.1; 101/128.1
[58] Field of Search ............ 101/127.1, 127, 128, 101/128.1

[56] References Cited

U.S. PATENT DOCUMENTS

| | | | |
|---|---|---|---|
| 3,303,777 | 2/1967 | Feier et al. | 101/127.1 |
| 3,483,820 | 12/1969 | Schuttenberg | 101/127.1 |
| 3,608,517 | 9/1971 | Shrott | 101/127.1 |
| 4,023,488 | 5/1977 | Zimmer | 101/127.1 |
| 4,023,524 | 5/1977 | Goldfarb et al. | 101/127.1 |
| 4,028,230 | 6/1977 | Rosenblum | 101/127.1 |
| 4,044,669 | 8/1977 | Luther | 101/127.1 |
| 4,357,869 | 11/1982 | Wadstein | 101/127.1 |
| 4,442,772 | 4/1984 | Bubley | 101/127.1 |
| 4,729,306 | 3/1988 | Bubley | 101/127.1 |
| 5,111,743 | 5/1992 | Umaba et al. | 101/127.1 |
| 5,152,219 | 10/1992 | Adachi et al. | 101/127.1 |

Primary Examiner—Edgar S. Burr
Assistant Examiner—John S. Hilten
Attorney, Agent, or Firm—William Squire

[57] ABSTRACT

The mounting of a printing plate (4) takes place with the help of a tie beam (3), which is displaceable with respect to a fixed side (2) of a frame.

The connection between the printing plate (4) and the side (2) of the frame or the tie beam (3) consists of a plurality of bolts (17), which are distributed along support bands (16) of the frame side (2) or tie beam (3).

The new apparatus allows printing plate (4) to be exchanged without requiring the frame (1) to be removed from the printing bench or the surface to be printed.

20 Claims, 2 Drawing Sheets

SOLDER OR CONDUCTIVE PASTE PRINTING STENCIL HOLDER

The invention relates to an apparatus for solder or conductive paste printing, with a frame for the clamping of an etched, milled or laser-cut printing plate made of metal or plastic, which is secured to at least two oppositely disposed sides of the frame, with the help of mounting apertures and bolts.

For small formats, this type of apparatus has, up to now, been constructed such that the relatively thin printing plate, typically with a thickness of a few tenths of a millimeter, has mounting apertures which are threaded upon bolts of the frame, the printing plate then being affixed with beams which are secured to the frame using threaded bolts.

When greater accuracy is required, or for larger formats, the printing plates have been secured to a printing screen which then is cut away in the region of the printing plate and subsequently mounted into a printing frame.

Both kinds of connection between the printing plate and the frame are such that a change of the printing plate requires a substantial effort, wherein the frame must be removed from the "printing bench", and after the replacement it must be again returned to its position.

The aim of the invention is to provide an apparatus in which a change of printing plate can be undertaken without each time having to remove the frame and then replace it in position.

According to the invention, this aim is attained in that one of the two opposed frame sides is constructed as a tie beam which is moveable with respect to the other side of the frame, the tie beam—in order to mount the plate, and guided by resiliently mounted guide bolts hingedly connected thereto—being displaceable with respect to an abutment which is located at a fixed distance to the other side of the frame; and further in that, along each of the two sides of the frame, and in the working plane of the frame which receives the plate, a support band for the plate is provided, the support band having distributed therealong a plurality of bolts provided with heads, by means of which plates of different thicknesses can, with the help of a spacer shim, be placed in the working plane and secured to the respective frame sides, wherein the bolts are directed inwardly into the space enclosing the frame.

By the displacement of the tie beam, the printing plate can be tensioned or relaxed. When in the relaxed condition, the new construction makes is possible for the printing plate with the mounting apertures to be removed from above, with a new printing plate being inserted, without having to remove the frame from the printing bench.

Advantageously, the support bands are made of thin sheet steel, having an elasticity which, during printing, makes possible an acceptable placement of the printing plate on the material to be printed.

In order to prevent the plate from being incorrectly inserted into the frame, it is advantageous to provide, at least for one of the support bands, a distribution of the bolts which is unsymmetrical with respect to the mid-plane extending perpendicular to the support bands. For the displacement of the tie beam it has been found appropriate for the beam to be shaped as a hollow extrusion, in which is inserted, in the longitudinal direction as a tensioning means, a tube which can be loaded through a check valve with a pressure medium, for example, air. Advantageously, the tube has a rectangular section, as well as a reinforced forward wall and side walls which, in the relaxed condition are folded in the manner of bellows.

A quite exact positioning of the printing plate with respect to the frame, and an avoidance of internal tensions and warping of the printing plate, is facilitated by providing, a bolt in the mid-plane of each side of the frame, with a corresponding mounting aperture in the plate, in order to provide a centering and position-establishing faculty wherein the diameters of the bolt and aperture closely match one another, while the remaining mounting apertures are formed as oblong openings surrounding the corresponding bolts with play. A uniform tension over the entire frame side can be attained if the elongate apertures are provided with a rectilinear support edge running perpendicular to the mid-plane.

The invention will now be more particularly described in terms of an example embodiment, using the drawings.

Figure 2:
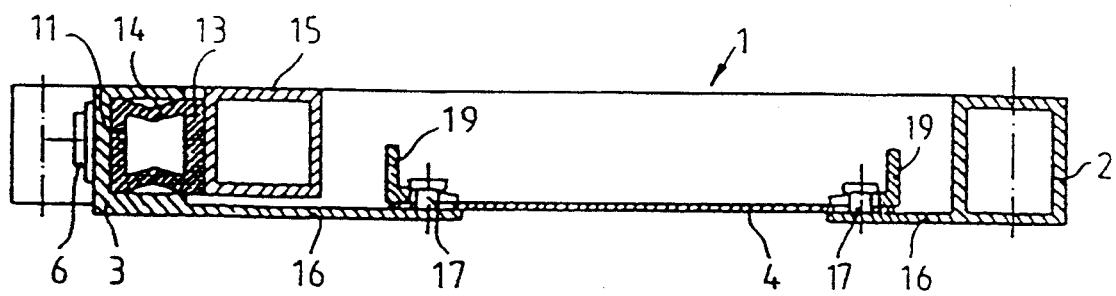
FIG. 2 is a cross-section taken at II—II in FIG. 1.

In a rectangular frame 1 (FIG. 1), assembled from hollow members (FIG. 2) which are likewise rectangular in section, a printing plate or printing screen 4 (FIG. 2) is stretched between a fixed side 2 of the frame on the right and, on the left, a side of the frame which is displaceable with respect to the fixed side of the frame 2, and is constituted by a tie beam 3, the printing plate or screen being only schematically represented. The movement of the tie beam 3, beyond which projecting arms 5 of the frame 1 extend at both ends, is controlled by guide bolts 6; the latter are mounted on linear bearings 7 in the frame 1 and are pressed by springs 8.

The connection between the tie beam 3 and the guide bolts 6 is by way of link members 9, which are capable of small rotational movements both around the guide bolts 6 and perpendicular thereto around pegs 10, through which they are connected with the beam 3. The articulated "mounting" of the tie beam allows the latter to accommodate small imbalances during the stretching of the printing plate 4, and thus to avoid jamming.

The tie beam 3 is a hollow profile (FIG. 2) which is U-shaped cross-section, and in which there is mounted a tube 11 which can be inflated through a check valve 12. The tube has a rectangular cross-section, a reinforced forward wall 13, and bellows-like foldable side walls 14.

Figure 1:
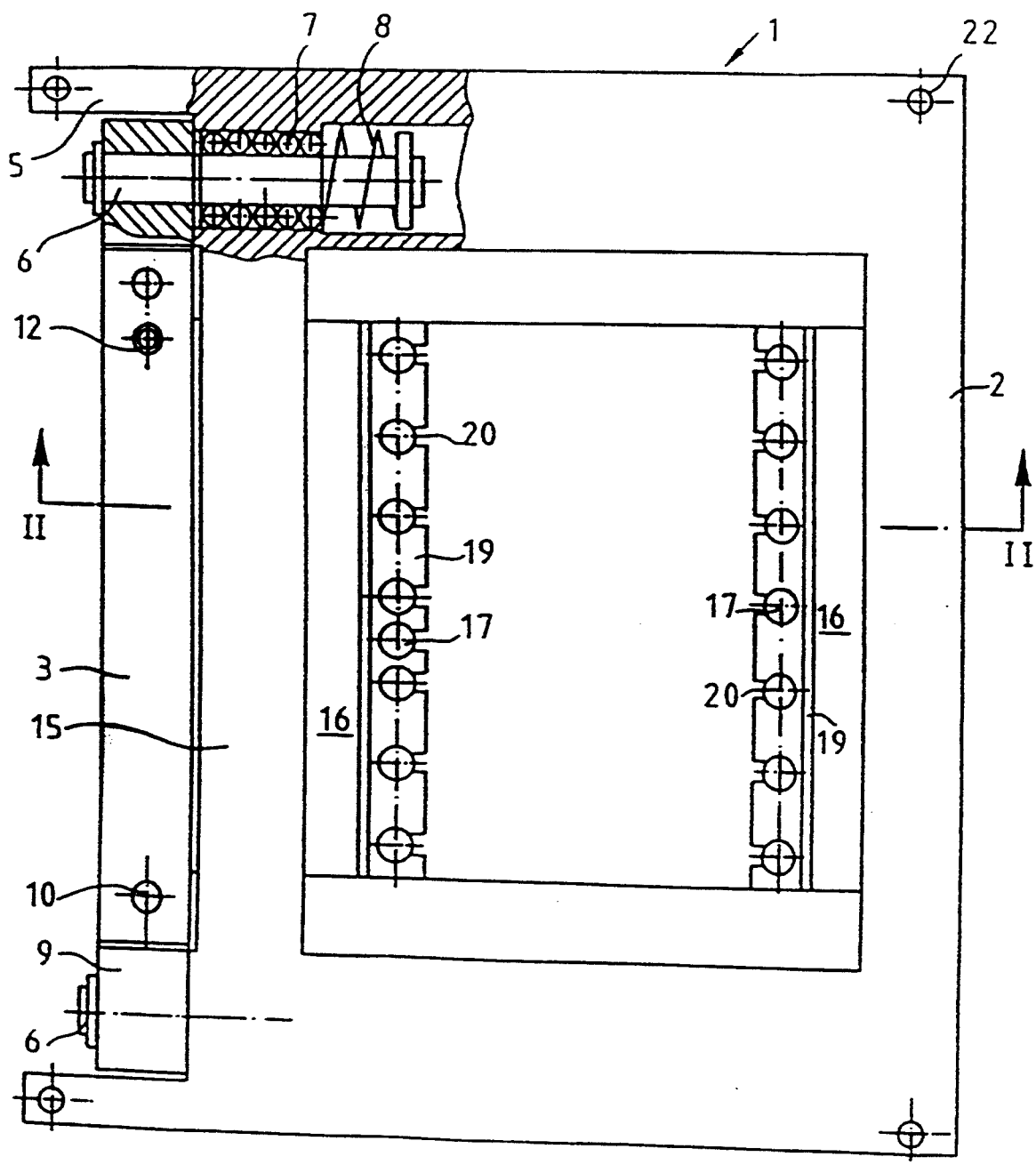
FIG. 1, shows, partly in section, a plan view of the frame of the new apparatus.

When inflated, the tube 11 expands, displaces the tie beam 3 to the left in FIG. 1, and in this manner stretches the printing plate 4, during which it is supported at its forward wall 13 from an abutment member 15 which is integrated into the frame 1 parallel to the fixed side 2 of the frame.

In the corners of the frame 1 there are threaded bores 22 into which non-illustrated micrometer screws can be provided, with which the height of the frame relative to the printed surface can be adjusted.

Provided on the side 2 of the frame and on the tie beam 3 are respective support bands 16 located in the working plane of the printing plate 4. A plurality of T-shaped bolts 17 each having a stem and a head are distributed along each support band 16. As FIG. 1 shows, the distribution of the bolts 17 along one support band 16 is asymmetrical. By virtue of such distribution, it can be ensured that the printing plate 4, which has correspondingly arranged and distributed attachment apertures 18 (FIG. 3), can be attached to the frame 1 in only a single position.

Figure 6:
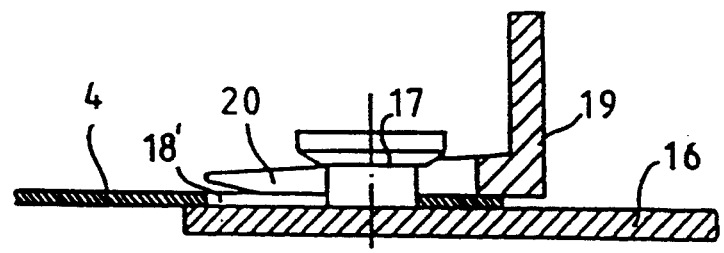
FIG. 6 is a section taken at VI—VI in FIG. 4.
Figure 4:
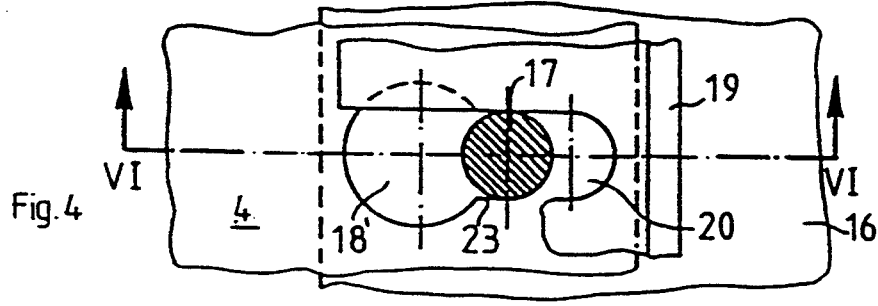
FIG. 4 shows, as an enlarged detail from FIG. 1, a plan view of the mounting aperture of the plate which lies in the mid-plane.

The attachment of the printing plate to the support bands 16 is carried out with the help of wedge shaped spacer shims 19, which have recesses 20 which conform in position and size to the bolts 17. With its wedge shape, which makes possible the securement of printing plates 4 of differing thicknesses, the spacer shims 19 when inserted grip the T-shaped bolts 17 from beneath, and connect the printing plate 4 to the support bands 16 (FIG. 6). At the same time, the spacer shims 19 hold the plate 4 in the working plane.

Figure 3:
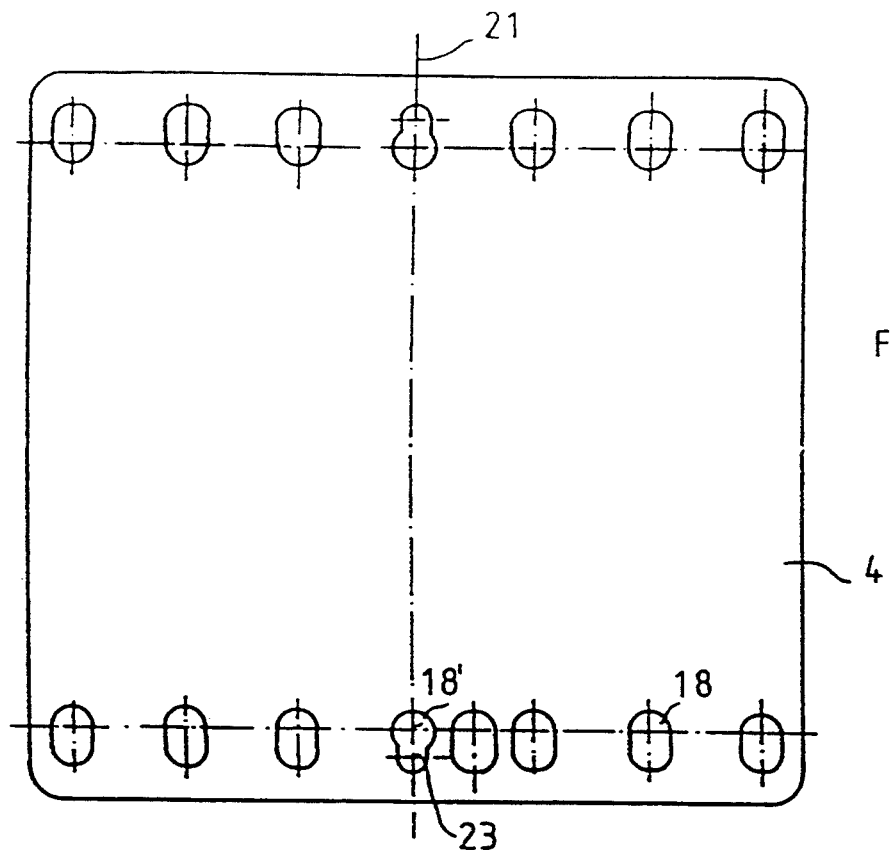
FIG. 3 is a plan view of an embodiment of the new printing plate.

As seen in FIG. 3, the printing plate 4 is provided with two different mounting apertures 18: in the midplane 21 are located pear-shaped mounting apertures 18', of which the neck 23 is matched to the diameter of the corresponding bolts 17; moreover, the neck 23 is centred in the mid-plane 21. The mid-plane 21 can thus serve as a null-line for the x-coordinate of an xy-coordinate system (not illustrated) with which the position of cardinal points on the printing plate can be exactly established. The null-line of the corresponding y-coordinate (also not illustrated) lies along the mid-line of the printing plate which is perpendicular to the plane 21.

Figure 5:
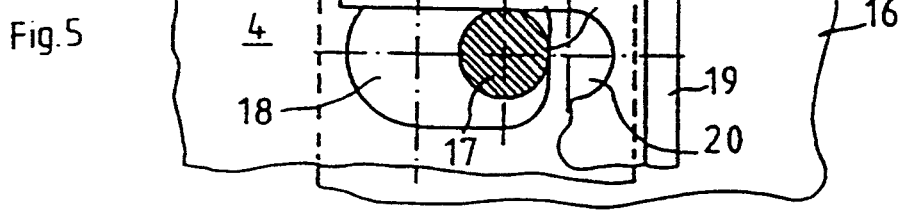
FIG. 5 shows, likewise enlarged, a plan view of an oblong aperture.

The remaining mounting apertures 18 are of oblong form, in which the bolts 17 can freely move in the lateral direction. By this means it is possible to avoid undue tension and warping when tightening the printing plate. As shown in FIG. 5, the edges 24 of the oblong apertures 18, which lie against the bolts 17 when the printing plate is tightened, have a rectilinear configuration. The latter ensures an even distribution of the tension forces along the whole length of the printing plate 4.

I claim:

1. An apparatus for solder or conductive paste printing including a frame defining a working plane and enclosing a space for mounting one of an etched, milled and laser-cut printing plate made of one of metal and plastic, said frame having two opposite sides, a plurality of mounting bolts and a plurality of apertures the printing plate being secured to at least said two opposite sides of the frame with said plurality of mounting apertures and said plurality of mounting bolts, characterized in that,
one of the two sides of the frame is a tie beam and includes means for moving the tie beam with respect to the other one of two sides, the tie beam being guided by resiliently mounted guide bolts and pivotally connected to said guide bolts, an abutment is secured to and located at a fixed distance from the other side of the frame said tie beam being displaceable with respect to said abutment, a support band for the plate provided along each of the two frame sides for the plate, the support band being in the working plane of the frame which receives the plate, there being, distributed along the support band, a plurality of said mounting bolts provided with heads for releaseably securing plates of differing thicknesses in the working plane, said mounting bolts being fixedly secured to the respective frame side, the mounting bolts extending inwardly from the working plane into the space enclosed by the frame, the plate being removable from said frame via said mounting bolts.

2. An apparatus according to claim 1, characterized in that, in at least one of the support bands the mounting bolts are distributed asymmetrically with respect to a mid-plane of the frame extending perpendicular to the support bands.

3. An apparatus according to claim 1 characterized in that the support bands are steel.

4. An apparatus according to claim 1 wherein the tie beam is a hollow extrusion extending in an elongation direction along one of said sides, in which extrusion a flexible tube, adapted to be loaded with a pressure medium through a check valve, is inserted in the elongation direction for tensioning the plate when the tube is pressurized.

5. An apparatus according to claim 4, characterized in that the tube has a relaxed condition and an expanded tension inducing condition, the tube further has a rectangular section and a reinforced forward wall and in the relaxed condition has bellows-like folded side walls.

6. An apparatus according to claim 1, characterized in that in the mid-plane of each frame side a mounting bolt and in the plate a corresponding mounting aperture are included having closely matching diameters for centering and position-establishing of said plate relative to said frame, whereas the remaining mounting apertures are elongated surrounding the corresponding mounting bolts with clearance.

7. An apparatus according to claim 6, characterized in that the elongated apertures each have straight abutment edges running perpendicular to the mid-plane.

8. The apparatus of claim 1 further including a spacer shim for selectively altering the space between the support band and said mounting bolt heads for closely receiving a printing plate of a corresponding thickness therebetween.

9. The apparatus of claim 8 wherein the shim is tapered for selectively releasably clamping said plates of differing thicknesses to said support band and bolt heads.

10. A printing plate for solder or conductive paste printing, for use in a solder or paste applying apparatus including a plurality of mounting bolts extending in a direction along opposite frame sides, said plate comprising at least two opposing sides with edges, said plate having first mounting apertures along the edges of at least said two opposing sides, both said edges of the plate being a second corresponding elongated centering mounting aperture for the positioning and centering of the plate in the apparatus, said second elongated centering mounting aperture decreasing in width toward the corresponding plate edge, said first and second apertures receiving one of said mounting bolts for releasably securing the plate to said frame sides.

11. A printing plate according to claim 10 wherein the frame sides have edges, a different portion of the first apertures corresponding to a different frame side, the first apertures comprising elongated openings and have a substantially straight edge extending in a direction along the edge of the corresponding frame side.

12. A printing plate according to claim 10, characterized in that the first and second mounting apertures are arranged along a frame edge asymmetrically with respect to a mid-plane of that frame side.

13. An apparatus for solder or conductive paste printing with a printing plate having a plurality of apertures, said apparatus comprising:
- a frame having at least two opposite sides defining a working plane and enclosing a space, one of said sides comprising a hollow tie beam moveable relative to the other side;
- a flexible tube in the tie beam having means for being pressurized for tensioning the plate, said tube having a rectangular section in the pressurized state and bellows-like folded sides in the relaxed state:
- resilient means including guide means for resiliently guiding the tie beam relative to the frame other side:
- means for pivotally connecting the resilient means to said tie beam;
- a support band connected to each of said sides for receiving said printing plate in said working plane: and
- a plurality of plate mounting bolts distributed along each said support band adapted to mate with and receive said plate apertures, said bolts having heads spaced from said support bands for releaseably receiving plates of differing thicknesses therebetween in the frame working plane, said bolt heads extending into said space.

14. The apparatus of claim 13 wherein one of said tube sides includes a reinforced wall adjacent to said tie beam and secured to the other side.

15. The apparatus of claim 13 further including shim means adapted to provide different spacings between said bolt heads and corresponding support band to closely receive corresponding different thickness plates between the corresponding support band and heads.

16. The apparatus of claim 13 wherein said means for hingedly securing includes means for hingedly securing the resilient means for rotation about two orthogonal axes.

17. The apparatus of claim 13 wherein one of said tube sides includes a reinforced wall adjacent to the tie beam and secured to the other of said sides, said tube expanding against said wall in response to said pressurizing for displacing said tie beam relative to the wall in a tensioning direction relative to the other side.

18. An apparatus for solder or conductive paste printing with a printing plate having a plurality of plate securing apertures, said apparatus comprising:
- a frame having at least two opposite sides defining a working plane and enclosing a space, one of said sides comprising a hollow tie beam moveable relative to the other side;
- a flexible tube in the tie beam adapted to be pressurized for tensioning the plate, said tube having a rectangular section in the pressurized state and bellows-like folded sides in the relaxed state:
- resilient means including guide means for resiliently guiding the tie beam relative to the frame other side;
- means for hingedly connecting the resilient means to said tie beam;
- a support band connected to each said sides for receiving said printing plate in said working plane;
- a plurality of plate securing bolts distributed along each said support band adapted to mate with and receive said plate apertures, said bolts having heads spaced from said support bands for releaseably receiving plates of differing thicknesses therebetween in the frame working plane, said bolts extending into said space; and
- a mounting positioning bolt centrally located on each frame side for receiving a corresponding centrally located positioning aperture in said plate, the positioning bolt and aperture having closely matching diameters for centering and positioning the plate relative to the frame, said securing apertures being larger than the corresponding securing bolts received thereby for providing play therebetween.

19. The apparatus of claim 18 wherein said resilient means comprises a pair of like spaced resilient guide means including guide rods at opposite ends of said tie beam, said means for hingedly connecting including articulated means rotatable about two orthogonal axes for hingedly securing each said spaced resilient guide means to said tie beam at said opposing ends of the tie beam.

20. The apparatus of claim 18 further including tapered shim means adapted to provide different spacings between said bolt heads and corresponding support band to receive corresponding different thickness plates therebetween.

* * * * *